United States Patent
Escoffier

(10) Patent No.: US 9,059,239 B2
(45) Date of Patent: Jun. 16, 2015

(54) BIDIRECTIONAL TRANSISTOR WITH OPTIMIZED HIGH ELECTRON MOBILITY CURRENT

(71) Applicant: Commissariat a l'energie atomique et aux energies alternatives, Paris (FR)

(72) Inventor: Rene Escoffier, La Buisse (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 22 days.

(21) Appl. No.: 14/090,009

(22) Filed: Nov. 26, 2013

(65) Prior Publication Data

US 2014/0145203 A1 May 29, 2014

(30) Foreign Application Priority Data

Nov. 26, 2012 (FR) ..................... 12 61252

(51) Int. Cl.
| | |
|---|---|
| *H01L 31/0256* | (2006.01) |
| *H01L 29/747* | (2006.01) |
| *H01L 29/20* | (2006.01) |
| *H01L 29/778* | (2006.01) |
| *H01L 29/10* | (2006.01) |
| *H01L 29/06* | (2006.01) |

(52) U.S. Cl.
CPC .......... *H01L 29/747* (2013.01); *H01L 29/2003* (2013.01); *H01L 29/7786* (2013.01); *H01L 29/0623* (2013.01); *H01L 29/1029* (2013.01); *H01L 29/1045* (2013.01)

(58) Field of Classification Search
CPC ............ H01L 29/1029; H01L 29/1045; H01L 29/747; H01L 29/7786; H01L 29/2003; H01L 22/12; H01L 29/7875; H01L 29/7878; H01L 51/5271; H01L 51/5268; H01L 51/0096; H01L 51/56
See application file for complete search history.

(56) References Cited

U.S. PATENT DOCUMENTS

| | | | |
|---|---|---|---|
| 2008/0143421 | A1 | 6/2008 | Yanagihara et al. |
| 2011/0275183 | A1 | 11/2011 | Beach |
| 2013/0221409 | A1* | 8/2013 | Nakajima et al. ............. 257/194 |

FOREIGN PATENT DOCUMENTS

EP 0115668 8/1984

* cited by examiner

*Primary Examiner* — Dung Le
(74) *Attorney, Agent, or Firm* — Occhiuti & Rohlicek LLP

(57) ABSTRACT

An apparatus includes a bidirectional hetero junction field-effect power transistor having a gate between conduction electrodes, semiconductor layers, one formed on the other, and the two meeting at an electron gas layer interface, and a reference electrode embedded in one layer. The reference electrode connects to a potential of a zone of the gas layer that is plumb with the reference electrode, A distance between the reference electrode and one conduction electrode and between the gate and that conduction electrode is between 45 and 55% of a distance between the conduction electrodes. A control circuit connected to the reference electrode generates a switching voltage for switching the transistor from a reference electrode voltage, and to apply a control voltage to the gate.

15 Claims, 2 Drawing Sheets

BIDIRECTIONAL TRANSISTOR WITH OPTIMIZED HIGH ELECTRON MOBILITY CURRENT

RELATED APPLICATIONS

Under 35 USC 119, this application claims the benefit of the priority date of French Patent Application 1261252, filed Nov. 26, 2012, the content of which is herein incorporated by reference.

FIELD OF DISCLOSURE

The invention relates to circuits comprising bidirectional power transistors used for example in high-frequency applications, and in particular to those requiring a bidirectional functionality based on high electron mobility transistors.

BACKGROUND

Many current or future electronic applications are being or will be required to function at higher and higher frequencies. These applications are not limited to the telecommunications market. Switches in high-frequency ranges are also required for vehicle-borne electronics intended for automotive and ground-based means of transportation, for aeronautics, and for medical systems or in-home automation, for example. These applications, for the most part, require high-power switches, typically switching between 500 V and several kilovolts, with currents most often between 10 and 200 A, functioning in frequency ranges above one megahertz.

Historically, high-frequency power switches have used field-effect transistors based on a semiconductor channel. At lower frequencies, junction transistors (thyristors, etc.) are preferred because they are able to withstand higher current densities. However, because of the relatively limited breakdown voltage of each of these transistors, power applications require many transistors to be used in series. These series transistors generate substantial losses, both in the steady-state and switching regimes.

Alternatively, high electron mobility transistors (HEMTs), also denoted by the term heterostructure field-effect transistors (HFETs), may be used in high-frequency power switches. Such transistors include a superposition of two semiconductor layers having different bandgaps, forming a quantum well at their interface. Electrons are confined to this quantum well and form a two-dimensional electron gas. To withstand high-voltage and temperature, these transistors will be chosen to have a wide bandgap.

Among wide bandgap HEMT transistors, those based on gallium nitride are very promising. The width of their bandgap results in a higher avalanche voltage, compared to conventional electronic materials (Si, SiGe, GaAs, InP), in a high carrier saturation velocity, and in good thermal and chemical stability (enabling use in extreme environments). The breakdown field of gallium nitride (GaN) may thus be higher than $3 \times 10^6$ V/cm, thereby easily allowing transistors with breakdown voltages higher than 100 V to be produced (300 nm of GaN is sufficient). In addition, such transistors allow very high current densities to be obtained because of the high electron mobility inside the interface gas.

Gallium nitride has a bandgap width of 3.39 eV. In addition, ternary alloys such as AlGaN or InGaN may easily be produced in a tool for forming GaN by epitaxy. A HEMT transistor based on gallium nitride may also be produced on a silicon substrate (which is the workhorse substrate of the semiconductor industry). GaN HEMT transistors are therefore much less expensive to produce than transistors based on SiC for example. Even though SiC-based transistors also have a wide bandgap, ternary alloys are difficult to produce with this material, and it cannot be grown on a standard silicon substrate, thereby making its fabrication cost prohibitive and greatly limiting its applications.

The document published by M. Tatsuo Morita entitled "650 V 3.1 m$\Omega$.cm$^2$ GaN-based monolithic bidirectional switch using normally-off gate injection transistor" pages 865-868 of the proceedings of the IEEE conference "Electron Devices Meeting 2007," describes a monolithic bidirectional switch comprising two AlGaN/GaN normally-off transistors connected back-to-back with a common drain. Switching of these transistors is controlled by way of respective gates. The voltage of each gate is referenced to the source potential of the corresponding transistor. Therefore, the gate voltages are referenced to different potentials. The control circuit of the gates is thus complicated to produce, in particular for such a frequency level.

U.S. Pat. No. 7,982,240 provides a solution allowing a single control signal to be applied to the gate of a single normally-on transistor. Two Schottky diodes are here connected in series between the source and drain of the transistor. The diodes have common anodes, one cathode is connected to the source of the transistor, and the other cathode is connected to the drain of the transistor. The source and drain functions of the transistor are in practice inverted depending on the flow direction of the current. The connection node of the anodes of the diodes delivers a reference potential in order to allow the gate of the transistor to be biased relative to this reference. The potential of this reference changes depending on the direction of the current flowing through the switch.

However, such a structure also has drawbacks. The diodes must be dimensioned for high voltages. The addition of such diodes implies the addition of etching masks during the fabrication process.

SUMMARY

The invention aims to remedy one or both of the foregoing drawbacks. Thus, the invention relates to a bidirectional heterojunction field-effect power transistor, characterized in that it comprises:
 first and second conduction electrodes and a gate placed between the first and second conduction electrodes, the distance between the gate and the first electrode being comprised between 45 and 55% of the distance between the first and second conduction electrodes;
 a first semiconductor layer and a second semiconductor layer formed on the first semiconductor layer, the first and second semiconductor layers forming an electron gas layer at their interface;
 a reference electrode embedded in the first semiconductor layer and electrically connected to the potential of the zone of the electron gas layer located plumb with it, the distance between the reference electrode and the first conduction electrode being comprised between 45 and 55% of the distance between the first and second conduction electrodes;
 a control circuit connected to the reference electrode, the control circuit being programmed to generate a switching voltage for switching the transistor from the voltage of the reference electrode, and programmed to apply said control voltage to the gate.

In one embodiment, the electrode is placed plumb with the gate.

In another embodiment, the reference electrode is placed at the same distance from the first and second conduction electrodes.

In another embodiment, the reference electrode is a dopant implant embedded in the first semiconductor layer.

In yet another embodiment, the maximum dopant density in the implant is located a distance between 10 and 80 nm from the electron gas layer.

In one embodiment, the implant extends depthwise through the first semiconductor layer from the interface between the latter and the second semiconductor layer.

In another embodiment, the implant is separated from the interface between the first and second semiconductor layers by way of a thickness of semiconductor that is between 5 and 25 nm.

In another embodiment, the electron gas layer extends continuously between the first and second electrodes.

In yet another embodiment, the dopants of the implant are chosen from the group comprising Mg, Si, Zn, Cr and Fe.

In one embodiment, the maximum dopant density in the implant is comprised between $10^{18}$ and $10^{21}$ cm$^{-3}$.

In another embodiment, the first semiconductor layer mainly includes a binary nitride alloy.

In another embodiment, the binary nitride alloy is GaN.

In yet another embodiment, the second semiconductor layer mainly includes a ternary nitride alloy.

In one embodiment, the ternary nitride alloy is AlGaN.

The invention also relates to an electrical system, comprising:
 a transistor as described above; and
 a voltage source applying a potential difference higher than 100 V between the first and second conduction electrodes of the transistor.

Other features and advantages of the invention will become more clearly apparent from the description thereof given below, by way of non-limiting example, and with reference to the appended drawings, in which:

DETAILED DESCRIPTION

Figure 1:
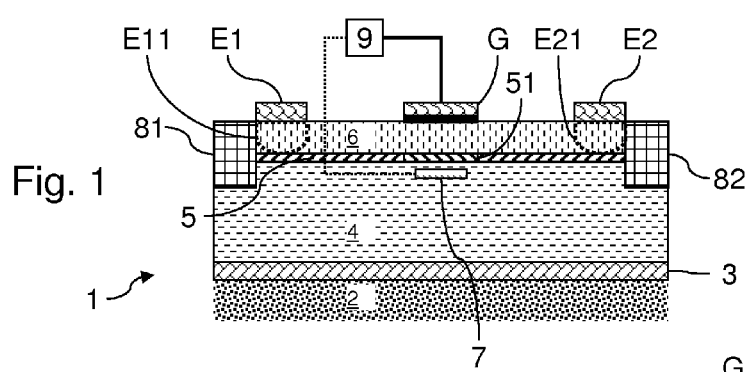
FIG. 1 is a schematic illustration of an example HEMT transistor according to an example embodiment of the invention.
Figure 2:
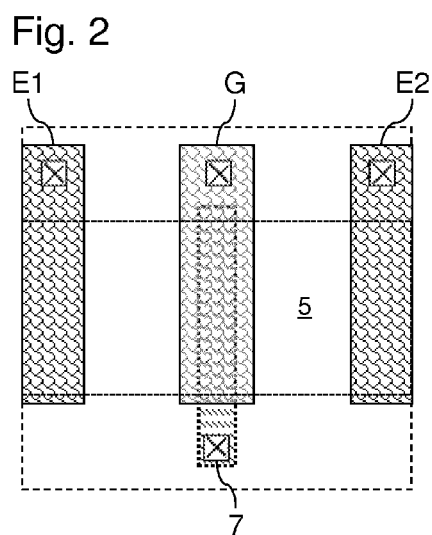
FIG. 2 is a top view of the transistor in FIG. 1.

FIG. 1 is a schematic cross-sectional view of an example HEMT transistor 1, also denoted by the terms "high electron mobility transistor" or "heterojunction field-effect transistor." FIG. 2 is a top view of the same transistor 1. The transistor 1 comprises a substrate 2, a buffer layer 3 placed on the substrate 2, a semiconductor layer 4 (for example of the III-V type, such as a group-III nitride), a semiconductor layer 6 made of another material (for example of the III-V type, such as a group-III nitride) and an electron gas layer 5 intrinsically formed at the interface between the layers 4 and 6.

The substrate 2 may be an insulator, or a semiconductor, such as intrinsic or doped silicon. In on example, the substrate 2 is silicon with a (111) lattice orientation. The substrate 2 may also be made of silicon carbide or of sapphire. The substrate 2 may be about 650 μm in thickness, and will typically be between 500 μm and 2 mm in thickness.

The buffer layer 3 deposited on the substrate 2 serves as an intermediary between the substrate and the nitride layer 4 in order to allow lattice matching between the substrate 2 and this nitride layer 4. The buffer layer 3 may typically be made of aluminium nitride.

The nitride layer 4 may typically have a thickness between 100 nm and 5 μm. The nitride layer 4 may be formed by epitaxy on the buffer layer 3. The nitride layer 4 is typically a binary group-III nitride alloy, for example GaN.

The nitride layer 6, typically called the barrier layer, may typically be between 5 nm and 40 nm in thickness, for example 25 nm in thickness. The nitride layer 6 may be formed by epitaxy on the nitride layer 4. The nitride layer 6 is typically a ternary group-III nitride alloy, for example AlGaN.

The transistor 1 comprises a first electrode E1 and a second electrode E2 between which current must selectively be established. The transistor 1 must allow current to flow both from the electrode E1 to the electrode E2 and from the electrode E2 to the electrode E1. Furthermore, the transistor 1 comprises a control gate G the control potential of which defines whether the transistor 1 is turned off or on. The electrodes E1 and E2 and the gate G are arranged on top of the layer 6. The gate G is arranged on the layer 6. It is possible for the gate G to be of various types, such as a Schottky or MIS (metal-insulator-semiconductor) gate structure, without it being necessary to alter the structure of the transistor 1.

In order to promote conduction current density, the electrodes E1 and E2 may for example be connected (as is illustrated by the junctions E11 and E21) to the layer 5 by, on the one hand, diffusion of the metal of these electrodes into the layer 6 and by, on the other hand, a tunnelling effect with the layer 5. A metal of the electrodes E1 and E2 initially deposited on this layer 6 is for example diffused into the layer 6 during an annealing step. Such a metal may be Ti or Al, having a low work function. During the annealing step, the Ti, for example, reacts with the GaN to form TiN. This reaction extracts nitrogen atoms from the GaN and generates nitrogen vacancies in the GaN layer. These nitrogen vacancies act as n-type dopants and create a highly doped region of a few nm in thickness, forming an ohmic contact to the layer 5 via a tunnelling effect. The layer 6 may optionally be thinned in line with the electrodes E1 and E2 by etching.

The layer 5 comprises a zone 51 plumb with the gate G. The zone 51 is made selectively conductive or insulating depending on the voltage applied to the gate G. Depending on the design of the transistor 1, the zone 51 makes this transistor either a normally-on transistor or a normally-off transistor, depending on the conductive or insulating state of the zone 51 when the gate G is unbiased. A control circuit 9 applies a bias voltage to the gate G, the bias voltage being defined relative to a reference voltage. The transistor 1 is isolated from other electronic components by isolation trenches 81 and 82.

The gate G is positioned substantially halfway between the electrodes E1 and E2. The gate G is, for example, located at a distance from the electrode E1 that is between 45% and 55% of the distance between the electrodes E1 and E2. The zone 51 is therefore located substantially halfway between the electrodes E1 and E2. A dopant implant 7 is formed in the layer 4. The implant 7 is positioned substantially halfway between the electrodes E1 and E2. The implant 7 is, for example, located at a distance from the electrode E1 that is between 45% and 55% of the distance between the electrodes E1 and E2. The distances must be considered relative to the conduction path through the layer 5. Thus, the electrodes E1 and E2 could be physically near to each other but isolated by an isolation trench, their electrical conduction distance then being greater than the physical distance in order to allow the isolation trench to be bypassed.

The implant 7 is advantageously placed under the gate G or at a distance smaller than the width of the gate from plumb with the gate G. The implant 7 is electrically connected to the control circuit 9 via an electrical connector. The implant 7 formed may be relatively thin, for example 500 nm in width, since it is not intended to pass current.

The potential of the implant 7 is used as a reference potential for the control circuit 9. Thus, with V7 being the voltage of the implant and Vg the gate voltage, Vg=V7+ΔV. Thus, the control circuit 9 selectively adds a voltage differential ΔV depending on the conduction state desired for the transistor 1. Thus, the voltage differential ΔV is adapted depending on the threshold voltage of the transistor 1. As the implant 7 is positioned substantially halfway between the electrodes E1 and E2, its potential is substantially equal to $V_{21}/2$ (where $V_{21}$ is the difference between the potential of the electrode E2 and the potential of the electrode E1). Therefore, the potential of the implant 7 may be taken as a floating reference potential whatever the direction of current flow between the electrodes E1 and E2. Thus, the transistor 1 is particularly simple to control. Moreover, the implant 7 makes it possible to ensure better control of the threshold voltage of the transistor 1. Furthermore, the transistor 1 then has a bidirectional current functionality in a smaller footprint since the transistor 1 does not need to be equipped with Schottky diodes for detecting the direction of current flow. This is in contrast to the switch described in patent U.S. Pat. No. 7,982,240, in which these diodes must be dimensioned to withstand the voltage applied between the electrodes E1 and E2. Furthermore, such a transistor 1 exhibits perfectly symmetric behaviour. Furthermore, forming the implant 7 only marginally increases the complexity of the process for fabricating the transistor 1.

Figure 3:
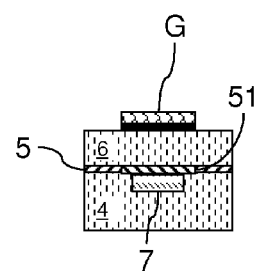
FIGS. 3 and 4 are cross-sectional views through different implant structures.

FIG. 3 is a schematic cross-sectional view of a first variant through an implant 7 extending to make electrical contact with the layer 5. The implant 7 is, for example, implanted into the layer 4, the layer 6 then being formed by epitaxy on the implant 7 and the layer 4. The implant 7 is at the potential of the zone 51. The maximum implanted dopant density of the implant 7 is, for example, located at a depth of 30 nm in order, on the one hand, not to interfere with conduction in the zone 51, and on the other hand, to detect the voltage of the zone 51 via a near-field effect. This implantation depth is advantageously between 10 nm and 80 nm, and preferably between 20 nm and 60 nm.

In this variant, the implant 7 is typically connected to the control circuit 9 via a high-impedance input in order to prevent a current from flowing between the implant 7 and the control circuit 9.

Figure 4:
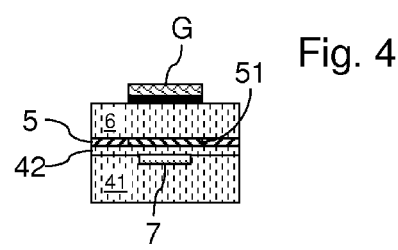

FIG. 4 is a schematic cross-sectional view of a second variant through an implant 7 separated from the layer 5. The implant 7 is here separated from the zone 51 by a semiconductor layer 42. The semiconductor layer 42 is, for example, produced by epitaxy, after the implant 7 has been formed, on the implant 7 and on a lower semiconductor layer 41. The layer 4 is here formed from layers 41 and 42 based on the same semiconductor. If the thickness of the layer 42 is suitably chosen, for example to be between 5 nm and 25 nm and preferably between 5 nm and 15 nm, the potential of the implant 7 will tend to that of the zone 51 via a tunnelling effect. In this case it is preferable to electrically connect the implant 7 to a high-impedance input of the control circuit 9.

The choice of the type of dopants used for the implant 7 will possibly be dictated by the ease with which the implantation step can be scaled-up or by the ease with which this implantation step can be integrated into an existing fabrication process.

Figure 5:
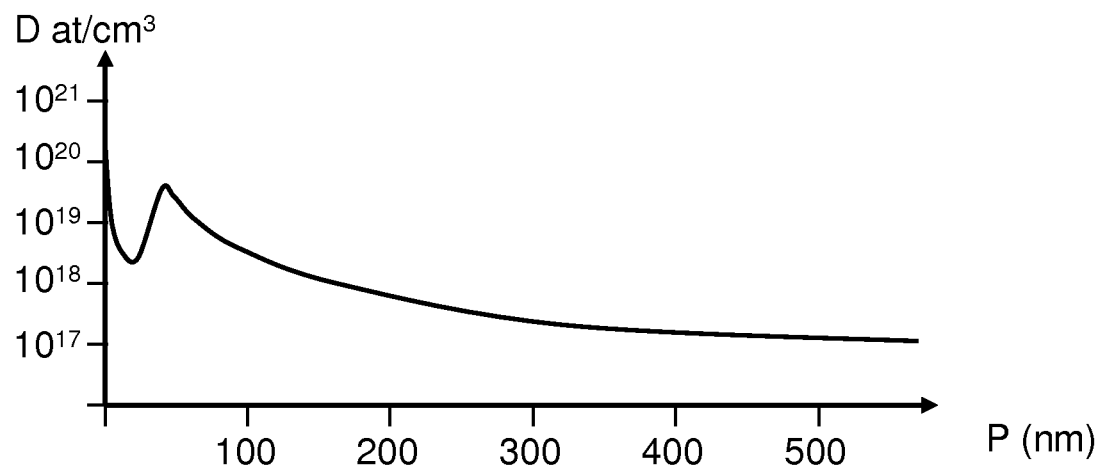
FIGS. 5 and 6 are graphs of implantation depths for a magnesium implant in a GaN layer.
Figure 6:
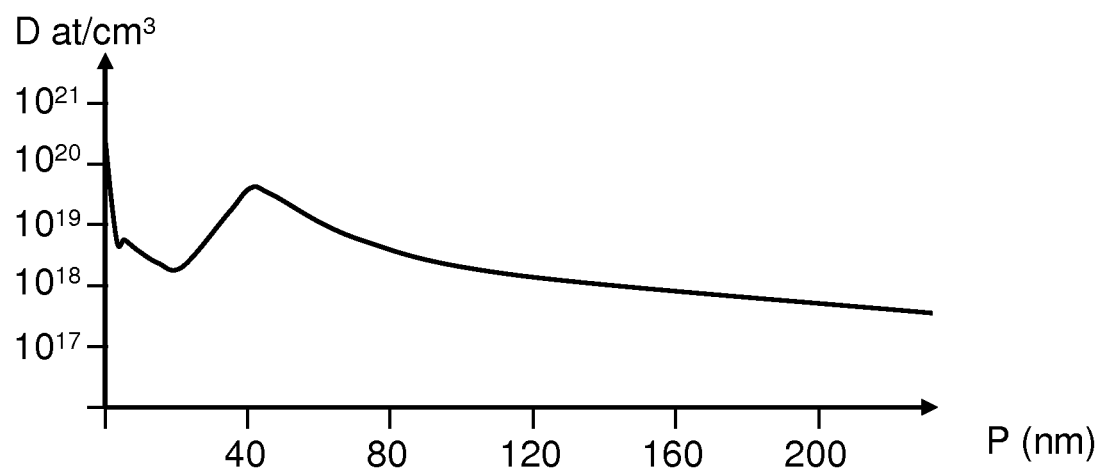

FIGS. 5 and 6 are graphs illustrating the dopant density in the implant 7 as a function of depth in the layer 4. The solid line corresponds to an implantation of magnesium with a density of $1.1 \times 10^{20}$ atoms/cm$^3$ in GaN. The implanted magnesium is activated by an annealing step. The density decreases with depth from 0 nm to 20 nm, increases with depth between 20 nm and 40 nm, peaks at 40 nm, then progressively decreases beyond 40 nm. Implantation of magnesium is the most advantageous process, the density of the implant being lower until the peak in order not to create an intrinsic field that would interfere with the zone 51, while having sufficient density to ensure the potential of the zone 51 is detected by the implant 7 via a tunnelling effect.

The transistor 1 is typically dimensioned for power applications, for example:
 for a voltage between the electrodes E1 and E2 higher than 100 V, preferably higher than 200 V, and advantageously for a voltage higher than 500 V; and
 for a current between the electrodes E1 and E2 higher than 10 A, preferably higher than 50 A, and advantageously for a current higher than 200 A.

The transistor 1 may for example be used at switching frequencies above 1 MHz, even above 1 GHz, for example for integration into the emitters of mobile-phone networks.

The invention claimed is:

1. An apparatus comprising a bidirectional hetero junction field-effect power transistor and a control circuit, wherein said bidirectional hetero-junction field-effect power transistor comprises
 a first conduction electrode,
 a second conduction electrode,
 a gate,
 a first semiconductor layer,
 a second semiconductor layer, and
 a reference electrode,
 wherein said gate is placed between said first conduction electrode and said second conduction electrode,
 wherein a distance between said gate and said first conduction electrode is between 45% and 55% of a distance between said first conduction electrode and said second conduction electrode;
 wherein said second semiconductor layer is formed on said first semiconductor layer,
 wherein said first semiconductor layer and said second semiconductor layer meet at an interface,
 wherein said first semiconductor layer and said and second semiconductor layer form an electron gas layer at said interface,
 wherein said reference electrode is embedded in said first semiconductor layer,
 wherein said reference electrode is electrically connected to a potential of a zone of said electron gas layer that is located plumb with said reference electrode,
 wherein a distance between said reference electrode and said first conduction electrode is between 45 and 55% of a distance between said first conduction electrode and said second conduction electrode; and
 wherein said control circuit is connected to said reference electrode,
 wherein said control circuit is programmed to generate a switching voltage for switching said field-effect power transistor from a voltage of said reference electrode, and
 wherein said control circuit is programmed to apply a control voltage to said gate.

2. The apparatus of claim 1, wherein said electrode is plumb with said gate.

3. The apparatus of claim 1, wherein said reference electrode is equidistant from said first and second conduction electrodes.

4. The apparatus of claim 1, wherein said reference electrode comprises a dopant implant embedded in said first semiconductor layer.

5. The apparatus of claim 4, wherein a maximum dopant density in said implant is disposed between 10 nm and 80 nm from said electron gas layer.

6. The apparatus of claim 4, wherein said implant has a depth that extends through said first semiconductor layer from said interface between said first semiconductor layer and said second semiconductor layer.

7. The apparatus of claim 4, wherein said implant is separated from said interface by a thickness of semiconductor, wherein said thickness is between 5 nm and 25 nm.

8. The apparatus of claim 1, wherein said electron gas layer extends continuously between said first and second electrodes.

9. The apparatus of claim 4, wherein said dopant implant is doped with a dopant chosen from the group consisting of Mg, Si, Zn, Cr, and Fe.

10. The apparatus of claim 4, wherein said implant has a maximum dopant density between $10^{18}$ cm$^{-3}$ and $10^{21}$ cm$^{-3}$.

11. The apparatus of claim 1, wherein said first semiconductor layer comprises a binary nitride alloy.

12. The apparatus of claim 11, wherein said binary nitride alloy comprises GaN.

13. The apparatus of claim 1, wherein said second semiconductor layer comprises a ternary nitride alloy.

14. The apparatus of claim 13, wherein said ternary nitride alloy is AlGaN.

15. The apparatus of claim 1, further comprising a voltage source configured for applying a potential difference higher than 100 V between said first and second conduction electrodes of said transistor.

* * * * *